United States Patent [19]

Hammond et al.

[11] Patent Number: 5,079,854
[45] Date of Patent: Jan. 14, 1992

[54] METHOD AND APPARATUS FOR CLEANING, COATING AND CURING RECEPTOR SUBSTRATES IN AN ENCLOSED PLANETARY ARRAY

[75] Inventors: John M. Hammond, Ontario; Robert W. Nolley, Rochester, both of N.Y.

[73] Assignee: Xerox Corporation, Stamford, Conn.

[21] Appl. No.: 457,958

[22] Filed: Dec. 27, 1989

[51] Int. Cl.⁵ .............................................. F26B 11/00
[52] U.S. Cl. ........................................ 34/187; 118/730
[58] Field of Search ................... 34/187, 186, 184, 68, 34/17, 18; 118/730, 58, 731, 500

[56] References Cited

U.S. PATENT DOCUMENTS

| | | |
|---|---|---|
| 291,320 | 1/1884 | Fitts ........................................ 34/186 |
| 1,566,482 | 12/1923 | Koppin ................................... 34/186 |
| 3,084,088 | 4/1963 | Hunkeler . |
| 3,417,733 | 11/1964 | Makino . |
| 4,074,654 | 2/1978 | Noguchi et al. . |
| 4,100,881 | 7/1978 | D'Andrea et al. . |
| 4,192,253 | 3/1980 | Aichert et al. . |
| 4,240,373 | 12/1980 | Anger . |
| 4,257,783 | 3/1981 | Gutjahr et al. . |
| 4,343,096 | 8/1982 | Bergland . |
| 4,365,423 | 12/1982 | Arter et al. . |
| 4,413,585 | 11/1983 | Weinhold et al. . |
| 4,452,171 | 6/1984 | Browning . |
| 4,475,479 | 10/1984 | Rinck et al. . |
| 4,545,321 | 10/1985 | Bassa . |
| 4,576,109 | 3/1986 | Bok . |
| 4,586,458 | 5/1986 | Taguchi et al. . |
| 4,595,607 | 6/1986 | Betteridge et al. . |
| 4,621,437 | 11/1986 | Grande et al. . |
| 4,623,559 | 11/1986 | Hudock . |
| 4,637,342 | 1/1987 | Kamiya et al. . |
| 4,640,220 | 2/1987 | Fallas . |
| 4,644,899 | 2/1987 | Glaus . |
| 4,687,686 | 8/1987 | Stofleth et al. . |
| 4,692,233 | 9/1987 | Casey . |
| 4,699,080 | 10/1987 | Finney . |
| 4,722,298 | 2/1988 | Rubin et al. . |
| 4,790,921 | 12/1988 | Bloomquist et al. . |
| 4,834,023 | 5/1989 | Saitoh et al. . |

Primary Examiner—Henry A. Bennet
Attorney, Agent, or Firm—Oliff & Berridge

[57] ABSTRACT

An apparatus and method for curing cylindrical and belt-like substrates include a curing chamber defining a horizontal central axis; a support structure selectively receivable within the curing chamber for supporting at least one substrate along a horizontal axis radially offset from and parallel to the central horizontal axis and for rotating the at least one substrate about the offset horizontal axis; and a curing device located within the curing chamber for expelling temperature controlled air toward the at least one substrate as the at least one substrate rotates about its offset horizontal axis. Preferably, the curing device is located along the central horizontal axis for expelling air radially outward. In a preferred embodiment, the support structure supports a plurality of substrates in a planetary configuration surrounding the central horizontal axis, each substrate being located along an offset horizontal axis radially spaced from and parallel to the central horizontal axis.

12 Claims, 7 Drawing Sheets

METHOD AND APPARATUS FOR CLEANING, COATING AND CURING RECEPTOR SUBSTRATES IN AN ENCLOSED PLANETARY ARRAY

BACKGROUND OF THE INVENTION

1. Field of the Invention

The invention relates to a method and apparatus for curing coated drum and flexible belt charge receptors for photocopiers. More particularly, the invention relates to an efficient method and modular apparatus for curing coated cylindrical or belt-like substrates by supporting the substrates in a planetary arrangement about a central horizontal axis, and mounting a curing structure in the center of the planetary array.

2. Description of Related Art

A photoreceptor is a cylindrical or belt-like substrate used in a xerographic apparatus. The photoreceptor substrate is coated with one or more layers of a photoconductive material, i.e., a material whose electrical conductivity changes upon illumination. In xerographic use, an electrical potential is applied across the photoconductive layer and then exposed to light from an image. The electrical potential of the photoconductive layer decays at the portions irradiated by the light from the image, leaving a distribution of electrostatic charge corresponding to the dark areas of the projected image. The electrostatic latent image is made visible by development with a suitable powder. Better control of the coating quality yields better imaging performance.

One method of coating substrates is to dip the substrate in a bath of the coating material. This method is disadvantageous because it usually results in a non-uniform coating. In particular, when the substrate is oriented vertically and dipped into a bath, the coating thickness tends to "thin" or decrease at the top of the substrate and "slump" or increase at the base of the substrate due to gravity induced flow of the coating material as the substrate is lifted from the bath. Thickness variations also occur even when the photoreceptor is oriented horizontally and dipped into the bath due to the formation of a meniscus as the substrate is removed from the bath. This variation in coating thickness causes variations in the performance of the photoreceptor. In addition, the dipping process requires additional processing controls because the bath must be constantly maintained in a state suitable for coating. The bath increases the size of the entire processing apparatus and is not readily adaptable to rapid changes in coating formulations. Further, changes in coating formulations are inhibited due to incompatibilities between formulations for successive coatings or layers. It is also difficult to incorporate cleaning and curing operations that are compatible with the dipping process for efficient modular operation as a manufacturing process.

In another method, an air assisted automatic spray gun uses high velocity air to atomize the coating formulation which is sprayed onto a substrate. Due to high mass transfer rates intrinsic to the use of atomizing air, this method entails considerable evaporative loss of solvent from the spray droplets and requires the use of slow evaporating solvents to prevent excessive solvent loss before the droplets arrive at the substrate. It is difficult to use this method in a sealed environment, and thus difficult to control the solvent humidity surrounding the substrates prior to, during, or after the coating process. In addition, the air atomized spray method creates a considerable amount of overspray which results in higher material usage. Air spray guns also are less advantageous for batch processing of a number of substrates.

OBJECTS AND SUMMARY OF THE INVENTION

It is thus an object of the invention to obviate the foregoing drawbacks of the prior art by providing a more efficient apparatus and process for fabricating rigid cylindrical or flexible belt photoreceptors.

Another object of the invention is to provide a method or apparatus which permits-batch processing of a plurality of substrates in compatible cleaning, coating and curing operations.

It is another object of the invention to provide an apparatus or method which obtains high quality coatings of uniform thickness.

Another object of the invention is to provide an apparatus or method for coating substrates which is modular and occupies a relatively small area per unit of production.

It is another object of the invention to provide an apparatus or method for coating substrates which is automatic and adaptable to different coating material formulations and substrates of differing diameters.

A further object of the invention is to provide a method or apparatus for processing substrate in a sealed environment in which solvent humidity can be controlled.

These and other objects and advantages are obtained by an apparatus and method for curing cylindrical and belt-like substrates in accordance with the invention. The inventive method and apparatus include a curing chamber defining a horizontal central axis; a support structure selectively receivable within the curing chamber for supporting at least one substrate along a horizontal axis radially offset from and parallel to the central horizontal axis and for rotating the at least one substrate about the offset horizontal axis; and a curing device located within the curing chamber for expelling temperature controlled air toward the at least one substrate as the at least one substrate rotates about its offset horizontal axis. Preferably, the curing device is located along the central horizontal axis for expelling air radially outward. In a preferred embodiment, the support structure supports a plurality of substrates in a planetary configuration surrounding the central horizontal axis, each substrate being located along an offset horizontal axis radially spaced from and parallel to the central horizontal axis.

BRIEF DESCRIPTION OF THE DRAWINGS

The invention will be described in detail herein with reference to the following Figures in which like reference numerals denote like elements and wherein.

DETAILED DESCRIPTION OF THE PREFERRED EMBODIMENTS

The invention will be described in relation to fabrication of cylindrical and belt-like substrates, and particularly rigid cylindrical and flexible belt photoreceptor substrates for photocopiers. The invention, however, is applicable to other coated substrates and/or coating processes.

Figure 1:
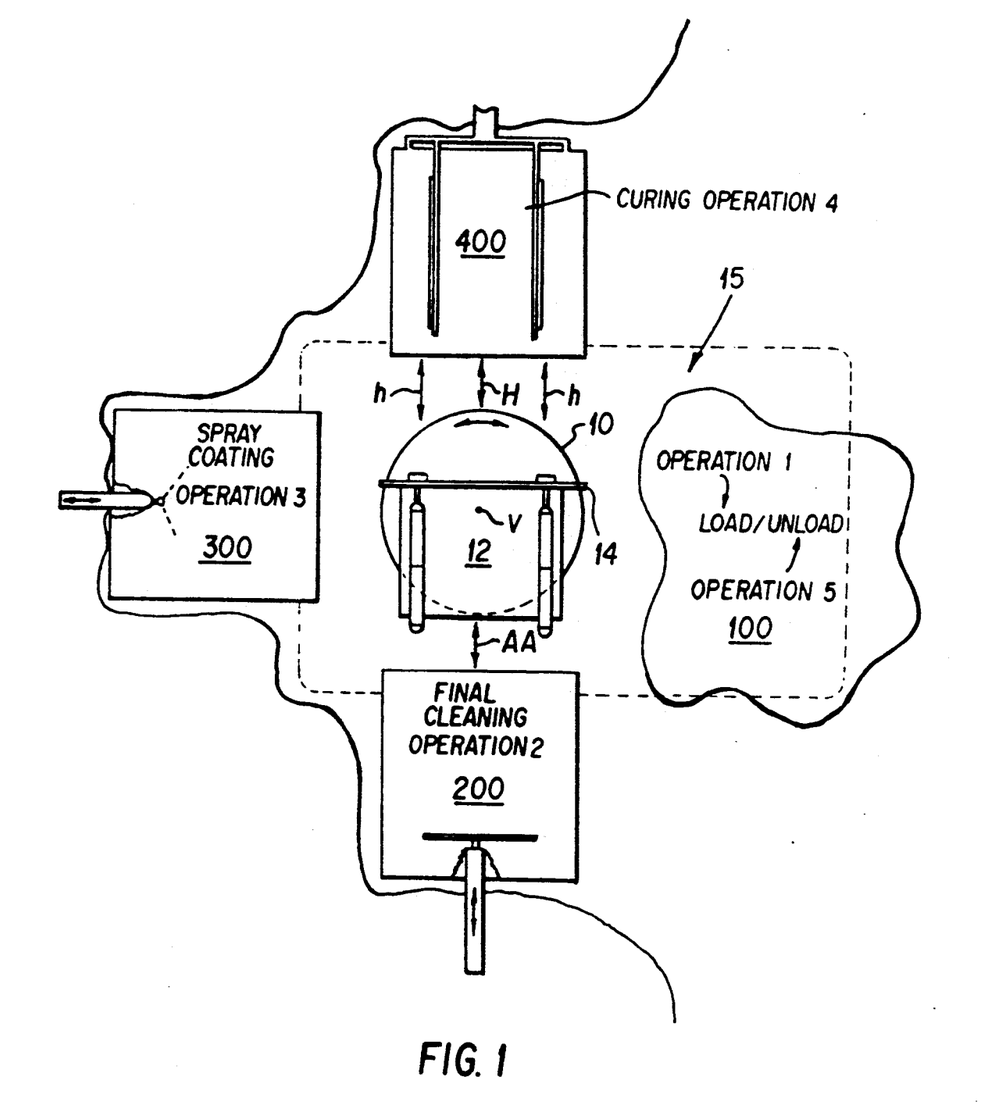
FIG. 1 is an overall schematic view of the apparatus and process in accordance with the present invention for fabricating rigid cylindrical and flexible belt photoreceptor substrates.

As illustrated in FIG. 1, the overall apparatus and process for fabricating substrates includes a carousel 10 rotatable to several different stations surrounding the carousel, namely a substrate loading/unloading station 100, a cleaning station 200, a coating station 300, and a curing or drying station 400. All the stations 100, 200, 300, 400 and the carousel 10 are preferably located within a class 100 or better clean area 15, which minimizes coating defects by eliminating human interaction with the substrate and shortening the exposure time to airborne contaminants.

As illustrated in FIG. 1, the carousel 10 includes a horizontal platform 12 rotatable about a vertical axis V in either the clockwise or counterclockwise direction. The carousel is rotated by any conventional mechanism under the control of an operator and/or computer program. The carousel 10 includes a support structure 14 preferably extending vertically from the platform 12 in a plane parallel to the vertical axis V about which the carousel 10 rotates. The support structure 14 preferably reciprocates along the platform 12 in a horizontal direction (represented by arrow AA) toward and away from the station facing the support structure, although it also is possible for the stations to reciprocate toward and away from the support structure. The reciprocation of the support structure or station is accomplished by any conventional mechanism under the control of the operator and/or computer program.

Figure 2:
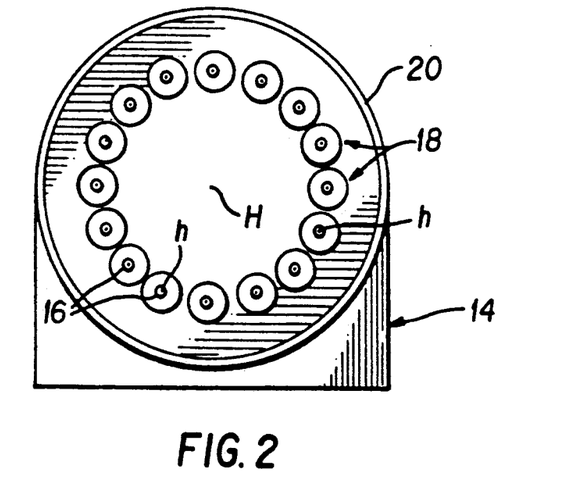
FIG. 2 is a schematic plan view of a carousel and substrate supporting structure.
Figure 3:
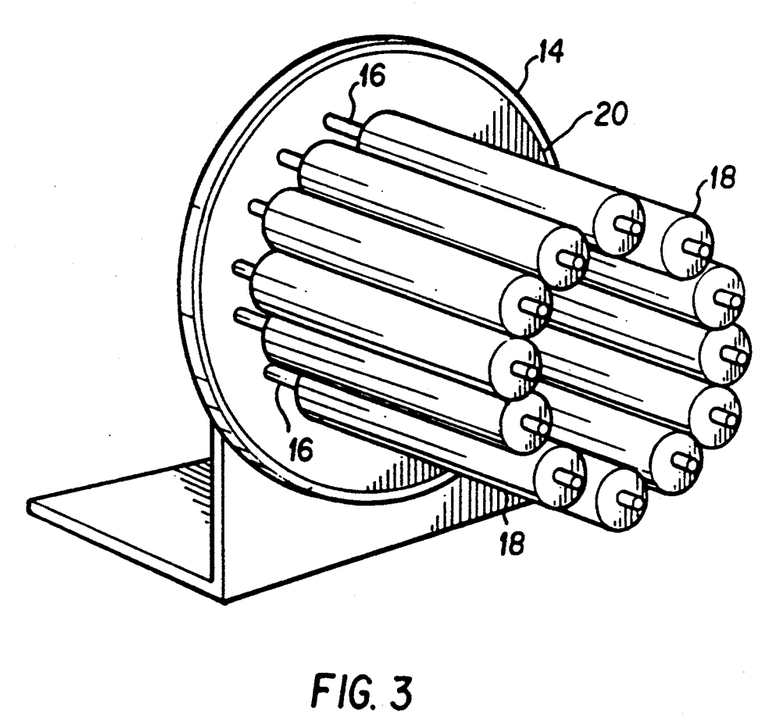
FIG. 3 is a schematic perspective view of the substrate supporting structure.

As best seen in FIGS. 2 and 3, the support structure 14 includes a planetary array of support arms 16, each defining an offset horizontal axis h radially spaced from a central horizontal axis H of the support structure 14. Each support arm 16 is capable of carrying at least one substrate 18 (and preferably two or more substrates) so that the support structure 14 provides a planetary arrangement of substrates 18, each substrate being parallel to but radially spaced from the central horizontal axis H. Preferably, the support arms are located in an annular array at equal radii relative to the central horizontal axis H so that the substrates are symetrically positioned relative to the horizontal axis H. Further, the support structure 14 carries a mechanism for rotating each support arm 16 about its offset horizontal axis h so that each substrate 18 in the planetary arrangement of substrates rotates about its offset horizontal axis h while being secured in a position parallel to but radially spaced from the central horizontal axis H. The support structure 14 can include any mechanism for rotating the support arm 16 and securing a substrate along the horizontal axis h, such as an interior rod-like structure, a rotatable cap or collet structure grasping the exterior surface of an end of the substrate, or a rotatable interior expanding structure insertable into the substrate for grasping the interior surface. Further, while the substrates illustrated in FIG. 2 can all have the same diameter (e.g., 84 mm), the support arms 16 are capable of supporting substrates of different diameters (e.g., 30 to 300 mm).

The planetary arrangement of substrates 18 on the support structure 14 permits a large number of substrates to be processed simultaneously thereby increasing the throughput of the process and decreasing manufacturing costs. Each support arm 16 can carry multiple substrates and simple adjustments and/or modifications permit processing of substrates of varying diameters. Further, the coating and curing stations described below can perform their operations from the central axis H radially outward while each substrate rotates about its offset axis h, so that each substrate is processed in an equal manner due to the radial symmetry thus ensuring uniformity and versatility in processing.

In overall operation, the carousel 10 rotates about the vertical axis to position the planetary array of substrates before any one station 100, 200, 300, 400. Once in position, the support structure reciprocates in the horizontal direction relative to the desired station to insert the planetary array of substrates 18 into the station. If the station includes a processing chamber, the support structure 14 preferably includes a sealing mechanism 20 about its periphery so that the support structure 14 functions as a closure member for sealing the chamber with the substrates located therein. The substrates are then processed within the sealed chamber, with each substrate rotating about its offset horizontal axis h. Once processed, the support structure 14 recedes from that station and the carousel 10 rotates to position the array of substrates for insertion into the next processing station.

The individual stations for the fabrication process referably are arranged in a symmetrical manner around the carousel 10. The basic processing steps are described below:

Operation 1:

The first operation is substrate loading in a loading-/unloading station 100. Uncoated charge receptor substrates are loaded onto each support arm 16 of the support structure 14, either manually or via a programmed robot arm. Each substrate 18 is loaded onto and secured by its support arm 16 along the offset horizontal axis h, which is then maintained parallel to and radially spaced from the central horizontal axis H.

Operation 2:

Substrate cleaning is the second operation performed at the cleaning station 200. The carousel 10 first rotates clockwise in FIG. 1, preferably 90°, to position the support structure 14 in front of the cleaning station 200 which includes a cleaning chamber 210 having a central horizontal axis colinear with the central horizontal axis H of the support structure 14. The support structure 14 then reciprocates toward the cleaning chamber 210 to insert the planetary array of substrates 18 into the chamber 210. When the support structure 14 closes against the cleaning chamber 210, the sealing mechanism 20 seals the chamber 210 with the substrates loaded therein.

Once inside the chamber, the substrates 18 are cleansed by any suitable mechanism such as liquid detergents, freon, or ozone with simultaneous exposure to ultraviolet light. The substrates 18 are rotated on their support arms 16 about their offset horizontal axes h during the cleaning operation so that each substrate is cleaned uniformly over its entire surface. The substrates preferably rotate during the cleaning operation at about 30-200 RPM. The atmosphere in the cleaning chamber is then exhausted and the substrates are withdrawn from the chamber 210 by reverse reciprocation of the support structure 14.

Figure 4A:
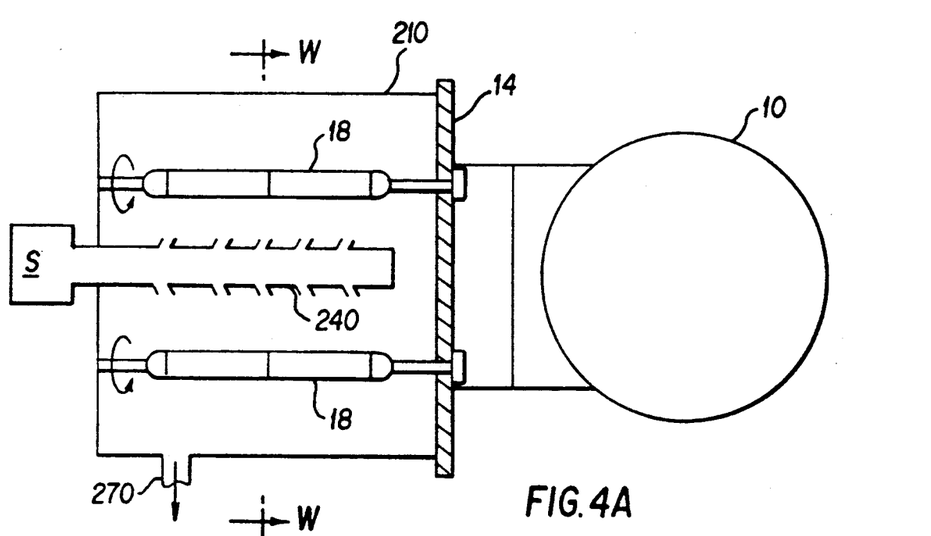
FIG. 4A is a schematic top cross-sectional view of the cleaning chamber with the substrates located in the chamber.
Figure 4B:
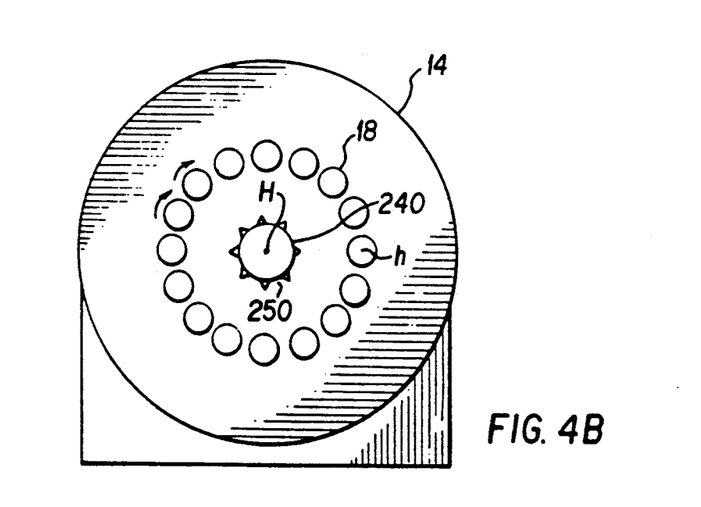
FIG. 4B is a schematic side cross-sectional view of the cleaning chamber taken along the line W—W of FIG. 4A.
Figure 4C:
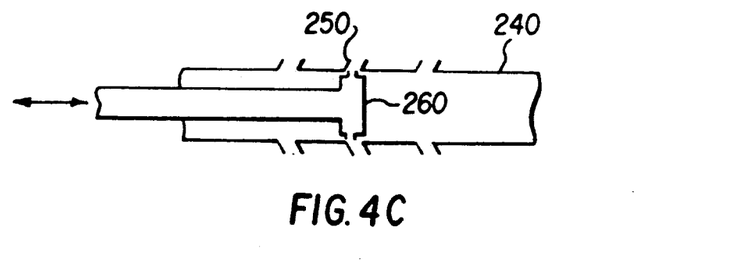
FIG. 4C is a schematic cross-sectional side view of an alternative nozzle structure for the cleaning chamber of FIGS. 4A and 4B.

In one embodiment (FIGS. 4A and 4B), the substrates are cleaned by exposure to a high pressure spray of a solvent based cleanser, such as a freon or detergent based solvent. The spray preferably emanates from a central conduit 240 located along the central horizontal axis H of the cleaning chamber 210, but other cleansing structures are possible including dedicated nozzles, i.e., a structure wherein each nozzle in an array of nozzles is directed to a particular substrate The central conduit 240 can have a series of nozzles 250 located therein for distributing the cleanser radially outward through all the nozzles simultaneously. Alternatively, the central conduit 240 can enclose a reciprocating outlet 260 (FIG. 4C) which sequentially communicates with each of the nozzles 250 to provide a sequential spray of cleansing material along the axis of each substrate. The reciprocating outlet can be moved by any conventional mechanism under a programmed control to ensure adequate spray through the outlets 250. In either embodiment, the spray from the central conduit 240 emanates radially outward, as the substrates 16 are rotating about their offset horizontal axes h, thus optimizing the coverage of all substrates with regard to angular impingement, spray pressure and distance from the spray nozzles. The flowrate of the cleanser and the time of spraying within the cleansing chamber are variable depending on the cleanser material and substrate to be cleaned. Once cleaned, the excess cleanser in the cleaning chamber is drained and any excess vapor is evacuated via a drain/exhaust mechanism 270 in the cleansing chamber 210. The cleansing chamber 210 can also be equipped with an air supply mechanism (as part of or separate from the central conduit 240) to supply air at sufficient temperatures to equilibrate the substrates to the required process temperature (to counteract evaporative cooling) and to reduce vapor emissions from the chamber. When the approximate temperature and vapor conditions are achieved, the support structure 14 retracts the substrate array 18 from the cleaning chamber 210 and moves the array to the coating station for further processing.

Operation 3:

The third operation is substrate coating at the coating station 300. The carousel rotates clockwise preferably another 90° to position the planetary array of cleaned substrates 18 before the coating station 300 which includes a coating chamber 310 defining a central horizontal axis colinear with the central horizontal axis H of the support structure 14. The support structure 14 then advances to insert the planetary array into the coating chamber 310 with the sealing mechanism 20 sealing the chamber. The substrates are then coated (via mechanisms described below) with a coating solution containing one or more materials useful in electrophotography. When the coating process is complete, the substrates are withdrawn from the coating chamber 310 by reverse reciprocation of the support structure 14.

In a preferred embodiment, the photoreceptors are coated using a solvent/polymer solution expelled from an electrostatic rotary atomizer 320 (FIGS. 5A and 5B) which is a commercially available device, such as the DEVILBISS AEROBELL and the GRACO CA 1000, CT 4000 or Micro-Bell rotary atomizers. Generally an electrostatic rotary atomizer 320 includes two parts: an atomizer housing 322 enclosing rotary turbine blades (not shown) and feed conduits (not shown) for a coating solution and a solvent; and a rotating bell or cap 324 spaced from one end of the atomizer housing 322. In operation, the coating solution and solvent are expelled through injection ports at the end of the atomizer housing 322 against the rotating bell or cap 324, which atomizes the coating solution and solvent and directs a charged spray radially outward from the rotary atomizer. As the bell or cap rotates, the atomizer 320 can be reciprocated along the axis of the substrate to be coated. Conventional mechanisms are available for rotating and reciprocating the atomizer 320. In accordance with the invention, the planetary arrangement of horizontal substrates surrounding the electrostatic rotary atomizer 320 are thus positioned in a symmetrical configuration with respect to the spray cloud produced by the rotary atomizer 320. Each substrate thus receives a uniform coating. To enhance the application of the coating, a fast evaporating solvent may first be sprayed into the sealed coating chamber (via a mechanism described below) to obtain a preset vapor pressure of up to saturation of the air within the chamber. The coating solution containing the same fast evaporating solvent is then sprayed using the electrostatic rotary atomizer 320 while rotating the substrates and reciprocating the atomizer back and forth along the central axis H in the center of the planetary configuration.

Figure 5A:
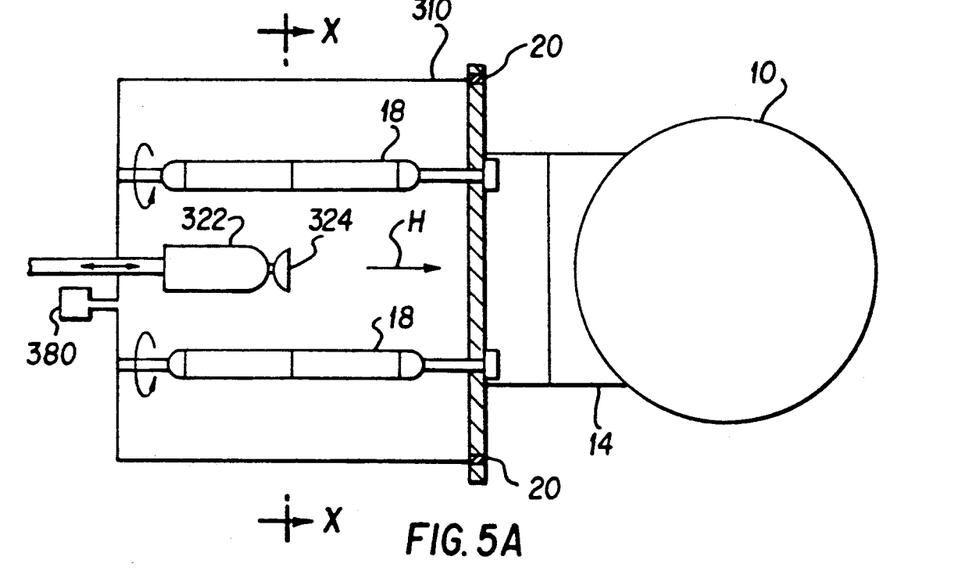
FIG. 5A is a schematic cross-sectional top view of the coating chamber.
Figure 5B:
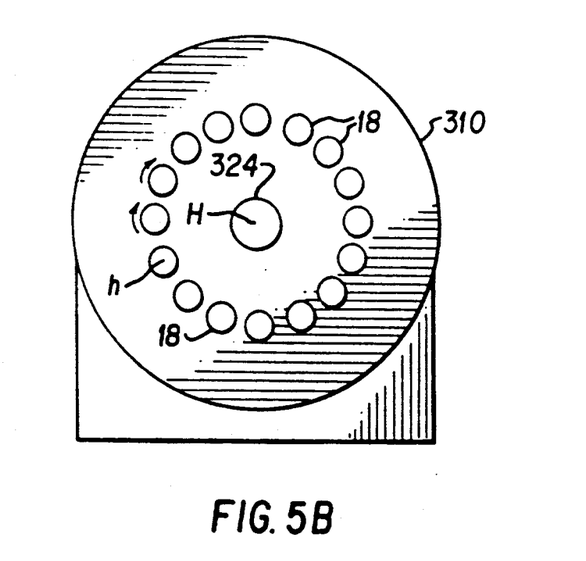
FIG. 5B is a schematic cross-sectional side view of the coating chamber taken along the lines X—X of FIG. 5A.

The reciprocating rotary atomizer centrally located in the planetary array of rotating substrates has several advantages. In addition to applying a uniform coating to the substrate, the atomization and curing processes are separated allowing each process to be better defined and controlled. In addition, fast evaporating solvents may be used to reduce the drying requirements by reducing the drying time and the energy required for drying. The atomizer centrally located in the sealed chamber of the planetary array of rotating horizontal substrate also provides for a narrow distribution of small droplets which allows for a uniform thin coating in all substrates without typical coating defects such as "orange peel" effects.

In a preferred embodiment, the coating formulation of a coating solution and solvent are expelled at about 50–400 cc/minute at an atomizer speed of 15,000–60,000 RPM, a reciprocation speed of 5–40 mm/sec, and an electrostatic voltage 30-150 kilovots (plus or minus charge). The coating formulation preferably has a concentration of 0.5-50% solid and a viscosity of 1-1000 centipoise. The substrates are rotating at about 20-100 RPM in a coating chamber having a temperature of 0-30° C. The coating formulation can include coating materials such as nylon, polyester or polycarbonate; and solvents such as methylene chloride, toluene, methanol, or ethanol. All the parameters discussed above may vary depending on the coating solution solvent and desired type of coating.

In the application of solvent based films on the charge receptor substrates using a rotary atomizer or other atomizer device, considerable solvent evaporation occurs during film coating and leveling. If solvent evaporation is excessive, the quality of the film coating is degraded. To counteract this potential disadvantage, the coating chamber is sealed and provided with a solvent vapor control mechanism 330 (FIG. 6) to limit and control the rate of solvent evaporation during droplet flight, film formation and film solidification. In summary, the solvent vapor control mechanism 330 introduces a controlled amount of solvent vapor into the coating chamber prior to film deposition, maintains the solvent concentration in the chamber gas near saturation during film leveling, and limits the rate of solvent vapor removal during the initial stages of solvent evaporation to prevent hydrodynamic instabilities which could cause patterning or pockets (i.e., an orange-peel effect) in the dried film. The solvent vapor control mechanism 330 can supply solvent either directly through the electrostatic rotary atomizer 320 or through a separate inlet device for introducing solvent into the coating chamber 310. The following description will focus on a solvent vapor control mechanism which introduces solvent into the coating chamber 310 through a separate inlet device, although those skilled in the art recognize that the mechanism 330 can be adapted to introduce solvent through the atomizer 320.

Figure 6:
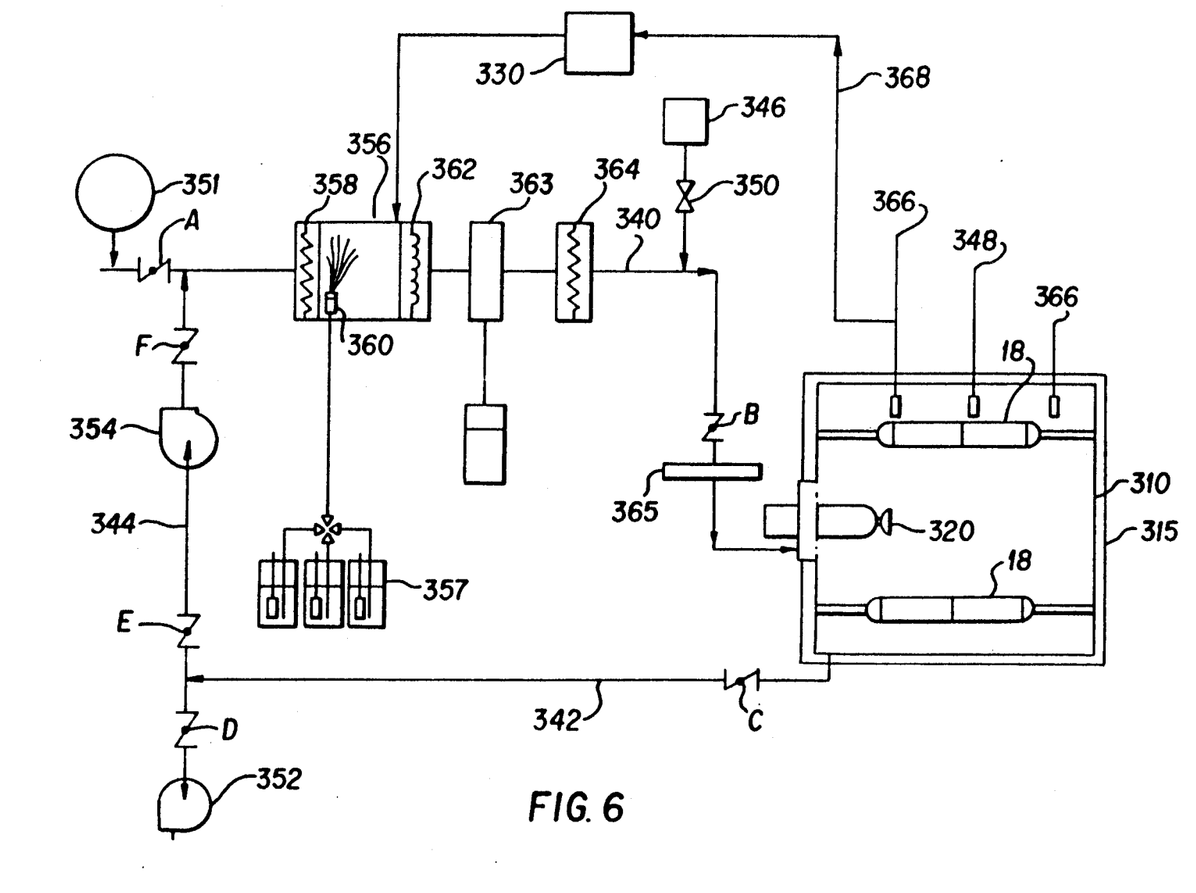
FIG. 6 is a schematic view of a solvent vapor control mechanism.

With reference to FIG. 6, the coating chamber 310 (which preferably includes an insulation jacket 315) communicates with a conduit mechanism having an inlet line 340, and outlet line 342 and a recirculation line 344 providing communication between the inlet and outlet lines 340, 342. The inlet line 340 may include a nitrogen gas supply 346 for purging the chamber to reduce the oxygen concentration in the chamber in the event flamable solvents are used for the film deposition. Oxygen sensors 348 can be located in the chamber 310 and/or outlet line 342. In operation, nitrogen valve 350 and damper B are opened to supply nitrogen gas through the inlet line 340 into the chamber 310 to dilute the air within the chamber (supplied via damper A and the clean air supply 351)) to a point where the concentration of oxygen is low enough (less than approximately 5%) so that combustion cannot be supported. Nitrogen is exhausted by opening dampers C and D and activating the exhaust blower 352. If flammable solvents are not used, the nitrogen purge is unnecessary.

To control solvent vapor in the chamber, the dampers are repositioned to open dampers A, B, C, E and F and close damper D while the recirculation blower 354 is started so that gas from the chamber 310 is continuously recirculated through the solvent from solvent supply 357 vapor introduction plenum 356 in the inlet line 340. As the gas passes through the plenum 356, a controlled amount of solvent (which is the same solvent in the coating formulation to be deposited) is added to the gas stream, and the temperature of the gas is controlled to create a desired relative solvent humidity. For example, if a chamber atmosphere of about 90% relative solvent humidity is desired, the solvent vapor introduction plenum is operated as follows:

1. As the gas enters the plenum, an upstream heater 358 raises the gas temperature to about 120-170° C.;

2. Solvent is sprayed into the warm gas stream by the solvent nozzles 360 and evaporates resulting in a gas mixture of about 50-100° C. and 20-80% relative solvent humidity;

3. The gas mixture passes through a chilling coil 362 operating at 5-30° C. and exits the coil at about 10-30° C. and 100% relative solvent humidity The saturated gas may then pass through a demister 363 and a second heater 364 to reheat the gas stream if a warmer temperature at lower solvent humidity are desired;

4. The conditioned gas then enters the coating chamber 310 (after passing through filter 365) to establish a gas mixture atmosphere within the chamber with a certain temperature and relative solvent humidity. Recirculation (via the outlet and recirculation lines 342, 344) through the solvent vapor introduction plenum 356 occurs until the overall solvent vapor concentration in the chamber reaches the desired level (i.e., typically 30-90%). A solvent monitor 366 (such as a spectrophotometer) within the chamber can be used to sense the temperature and relative solvent humidity within the chamber, and provide signals through a feedback circuit 368 to the control mechanism 330 for controlling the heater and cooler within the solvent vapor introduction plenum.

When the desired gas mixture temperature and relative solvent humidity are obtained, the dampers A-F are closed and the substrates are coated by the rotary atomizer 320 using a solvent based coating formulation using the same solvent as the solvent in the introduction plenum 356. An improved film quality is obtained because solvent evaporation during droplet flight and film leveling is minimized due to the presence of the solvent previously introduced into the chamber. Furthermore, it is possible to coat films carried by highly volatile solvents such as methylene chloride which would otherwise create a poor quality film without solvent presaturation. The opportunity to apply coatings formulated with more volatile solvent offers improved throughput due to shortened drying times and increase cost savings due to lower drying temperatures. In some cases, solvent evaporation is so fast that drying between layer applications may be eliminated. In those instances, a subsequent coating layer can be immediately applied as soon as the film is in a sufficiently invisid state.

After the coating is applied and leveled to a smooth film, the solvent vapor is removed by controlling evaporation of the solvent from the film. The controlled evaporation is accomplished by resuming recirculation of the gas mixture through the chamber by opening dampers A, B, C, E and F and activating the recirculation blower 354. The solvent saturated gas flows through the solvent vapor introduction plenum 356 with only the chiller coil 362 operating which condenses the solvent out of the gas stream. The liquid solvent draining from the chiller and demister is recovered in a containment vessel 370. The rate of solvent removal may be controlled by either controlling the gas flow rate (via the blowers and dampers) and/or controlling the chiller temperature. In either case, the second heater 364 reheats the incoming gas stream. When the solvent vapor concentration has been sufficiently lowered and the film is in a sufficiently invisible state, the gas recirculation is stopped and the support structure 14 retracts to remove the substrate 18 from the coating chamber. Alternatively, a subsequent coating layer may be applied as noted above.

The coating chamber may be further modified for fabrication of hybrid photoreceptor devices. For example, in addition to the structure for applying coatings via the rotary atomizer, the chamber could be fabricated with stronger walls, vacuum service lines 380 (FIG. 5A) and vacuum tight seals so that vacuum deposition of thin films could be performed in the chamber as well as solvent based rotary atomization spray coating. This dual capability permits production of different kinds of photoreceptors having a vacuum coating and an atomizer applied coating using the same apparatus thus further increasing the versatility and efficiency of the process.

Operation 4:

The fourth operation is film curing or drying at the curing station 400. The carousel 10 rotates clockwise preferably another 90° to position the planetary array of coated substrates 18 in front of the curing chamber 410 which also defines a central horizontal axis co-linear with the central horizontal axis H of the support structure 14. The support structure 14 is then advanced to insert the planetary array of substrates 18 into the chamber 410. If there is solvent present in the coating film, it is removed by exposure to high velocity heated air (e.g., 4000 cfm at 60-140° C. for 1-5 minutes). If the film is photochemically reactive, the film is cured by exposure to ultraviolet light. When curing is complete, the substrates are cooled by chilled air (if necessary) and then withdrawn from the chamber. If a multilayered film structure is desired, operations 3 and 4 are repeated as necessary with the carousel 10 cycling between the coating and curing chambers 310, 410.

Figure 7A:
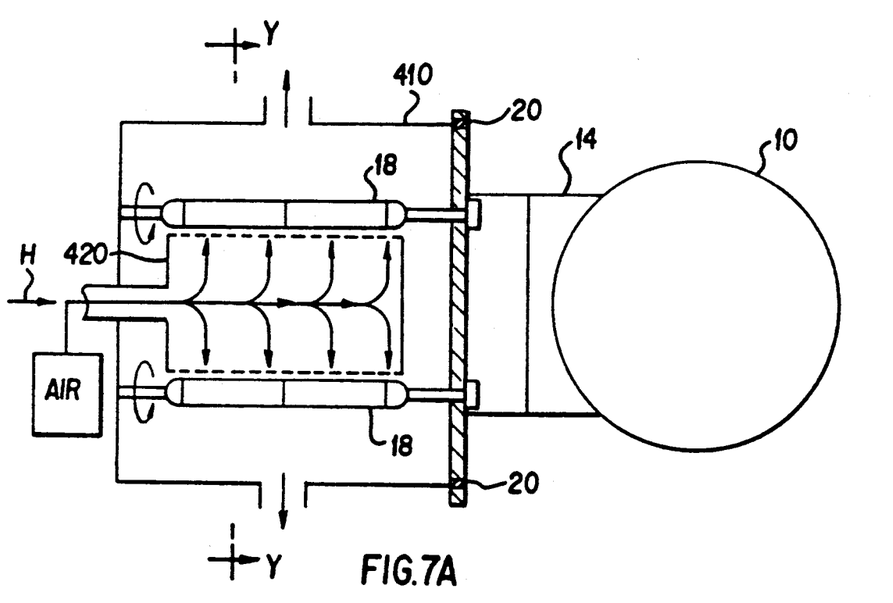
FIG. 7A is a schematic cross-sectional top view of a curing chamber.
Figure 7B:
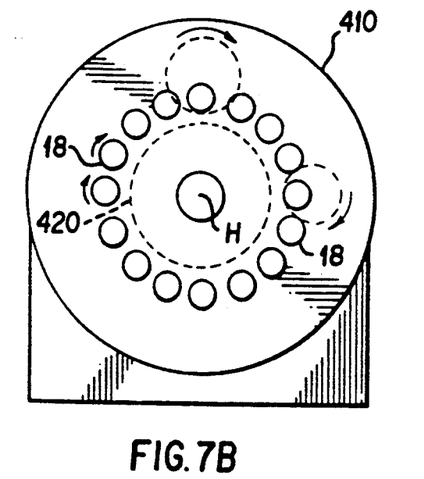
FIG. 7B is a schematic cross-sectional side view of the curing chamber taken along the lines Y—Y of FIG. 7A.
Figure 7C:
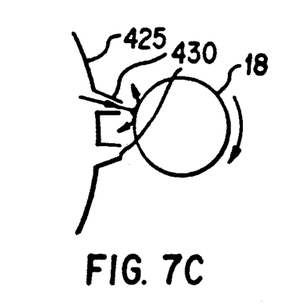
FIG. 7C is a schematic cross-sectional side view of an alternative nozzle structure for the curing chamber of FIG. 7A.

In a preferred embodiment, the curing chamber includes a curing mechanism to remove solvent from the freshly coated film on the substrate by exposing the substrate to a heated stream of high velocity air as the substrate rotates. The drying mechanism includes (FIGS. 7A and 7B) a perforated air supply plenum 420 communicating with the source of temperature controlled air. The plenum 420 is located along the horizontal axis H of the chamber 410 so as to be surrounded by the planetary arrangement of substrates 18. Clean heated air flows radially outward through the perforated plenum 420 at high velocity, and impinges on the rotating surfaces of the coated substrates (rotating at about 20-100 RPM). The high velocity air minimizes the boundary layer, and the resultant high heat and mass transfer rates permit rapid solvent removal. Although a perforated plenum wall is shown in FIGS. 7A and 7B, other configurations such as an air-fed cylinder 425 located along the central axis H and having nozzles 430 (FIG. 7C) aligned axially with the individual substrates may be used to impart high velocity air to the substrate rotating at about 20-100 RPM. Alternatively, the curing chamber may include an array of dedicated nozzles, each being directed to expel air toward a particular substrate.

The air supply temperature and flow rate are optimally controlled to minimize curing time without compromising coated surface quality and imaging performance. When the coated layer is cured adequately, the air supply temperature is lowered to below ambient temperature to rapidly cool the substrate to ambient temperature. The carousel 10 then returns the planetary array of substrates 18 to the coating chamber 310 for a further layer application, or to the load/unload station 100 if fabrication is complete.

The curing structure is compatible with the processing of substrates in a planetary configuration. In addition, the curing structure is versatile since the outward radial flow from the plenum to the substrate permits a single curing chamber to be used with batches of coated substrates of differing diameters. The planetary arrangement of substrates with the central curing structure provides a synthetical system which reduces drying times and reduces temperature variations in the substrate.

Figure 8A:
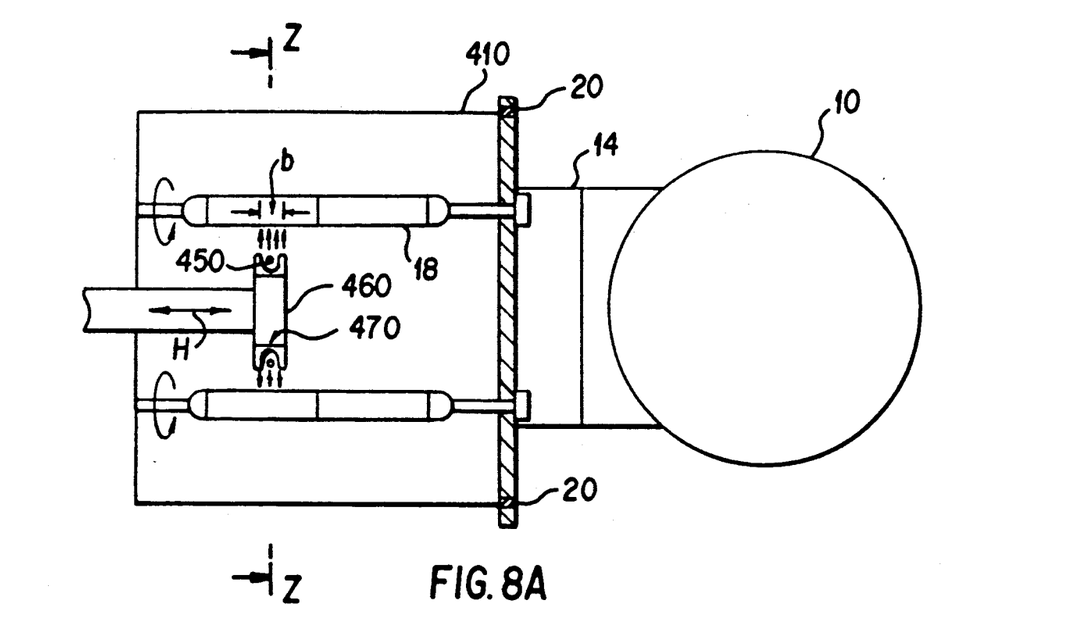
FIG. 8A is a schematic cross-sectional top view of another embodiment of the curing chamber.
Figure 8B:
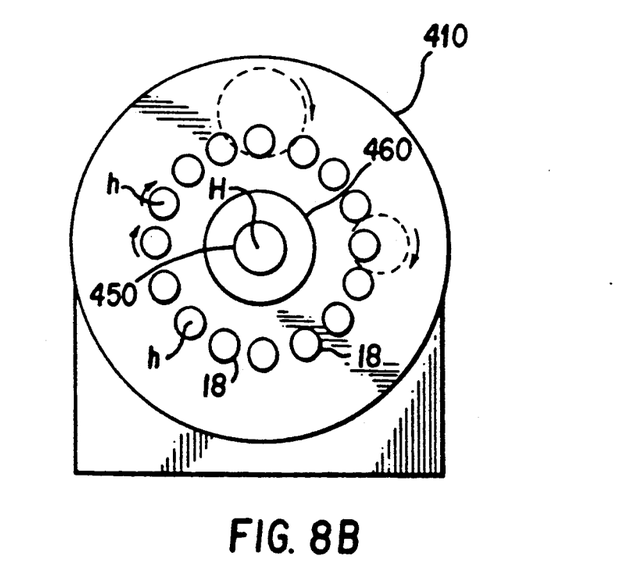
FIG. 8B is a schematic cross-sectional side view of the curing chamber taken along the lines Z—Z of FIG. 8A.

In another preferred embodiment, the curing station is capable of curing both substrates coated with a solvent based film by exposure to high velocity heated air, and substrates coated with photoreactive polymer films by exposure to ultraviolet light. For photoreactive polymer film coatings, the curing chamber 410 is equipped with an annular ultraviolet light source 450 (FIG. 8) having an axis co-linear with the central axis H. The light 450 is mounted within a concentric reflector 460 to provide a band b of light which radiates with equal intensity 360° around the reflector 460. The light source 450 and concentric reflector 460 are mounted on a carriage 470 which reciprocates along the central horizontal axis H as each substrate 18 rotates about the offset horizontal axis h. With this structure, a band b of ultraviolet light radiates outward and moves axially from end to end of the substrate 18 so that each substrate "sees" or is exposed to the band b of ultraviolet light several centimeters wide scanning along the axis of the substrate. Such exposure polymerizes the photochemically reactive coating on the substrate to produce a solid uniformly cured film. Optimum performance is obtained by matching reciprocation speed, rotational speed of the substrates, photochemistry of the film, intensity in wavelength of the ultraviolet lamp and width of the exposure band.

Operation 5:

The fifth operation is substrate unloading, preferably at the loading/unloading station 100. The carousel rotates clockwise preferably another 90° to the position occupied in Operation 1 where the coated and cured substrates are unloaded from the support structure manually or under programmed control. The finished charge receptors may then be inspected and packaged as desired.

The foregoing specification describes preferred embodiments of a novel method and apparatus for processing rigid drum and flexible belt charge receptors using individual stations for the fabrication steps arranged symmetrically around a central rotatable material handling device Further, each station is compatible for batch processing of substrates arranged in a planetary array which permits a large number of substrates to be processed simultaneously and uniformly The planetary substrate array also permits each substrate to be processed in an equal manner due to the radial symmetry The invention has been described with reference to the preferred embodiments thereof which are intended to be illustrative rather than limiting. Various changes and modifications may be made without departing from the spirit and scope of the invention as defined in the following claims.

What is claimed:

1. An apparatus for curing cylindrical and belt-like substrates, comprising:
   a curing chamber defining a horizontal central axis;
   a support structure selectively receivable within the curing chamber and including means for supporting at least one substrate along a horizontal axis radially offset from and parallel to the central horizontal axis and means for rotating the at least one substrate about the offset horizontal axis;
   curing means located along the central horizontal axis within the curing chamber for expelling temperature controlled fluid toward the at least one substrate as the at least one substrate rotates about its offset horizontal axis.

2. The apparatus of claim 1 wherein the curing means expels fluid radially outward.

3. The apparatus of claim 1 wherein the support structure supports a plurality of substrates in a planetary configuration surrounding the central horizontal axis, each substrate being located along an offset horizontal axis radially spaced from and parallel to the central horizontal axis.

4. The apparatus of claim 3, wherein the plurality of substrates are symetrically arranged in an annular array about the central horizontal axis, each substrate being equally radially spaced from the central horizontal axis.

5. The apparatus of claim 1 wherein the curing means is a perforated cylindrical plenum communicating with a source of temperature controlled fluid and supported along the central horizontal axis of the curing chamber.

6. The apparatus of claim 1 wherein the curing means includes a conduit having a series of nozzles communicating with a source of temperature controlled fluid, the conduit being supported along the central horizontal axis of the curing chamber, and the nozzles being axially aligned with each substrate.

7. The apparatus of claim 1 further comprising control means to vary the temperature and flow rate of fluid expelled from the curing means.

8. A method for drying cylindrical and belt-like substrates comprising the steps of:
   arranging a plurality of substrates in a planetary array about a central horizontal axis, each substrate defining an offset horizontal axis radially spaced from and parallel to the central horizontal axis;
   rotating each substrate about its offset horizontal axis; and
   expelling temperature controlled fluid from a curing mechanism located along the central horizontal axis, the temperature controlled fluid being expelled toward the substrates as the substrates rotate about their horizontal axes.

9. The method of claim 8 wherein the fluid is expelled radially outward from the curing mechanism.

10. An apparatus for curing cylindrical and belt-like substrates, comprising:
    a curing chamber defining a horizontal central axis;
    a support structure selectively receivable within the curing chamber and including means for supporting at least one substrate along a horizontal axis radially offset from and parallel to the central horizontal axis and means for rotating the at least one substrate about the offset horizontal axis;
    curing means located along the central horizontal axis comprising an ultraviolet light source.

11. The apparatus of claim 10, further comprising a reflector, said ultraviolet light source being annular and being positioned around and substantially concentric with said reflector.

12. The apparatus of claim 11, further comprising means for expelling temperature controlled fluid toward the at least one substrate.

* * * * *